United States Patent
Yeo et al.

(10) Patent No.: US 6,800,533 B1
(45) Date of Patent: Oct. 5, 2004

(54) INTEGRATED VERTICAL SPIRAL INDUCTOR ON SEMICONDUCTOR MATERIAL

(75) Inventors: Kiat Seng Yeo, Singapore (SG); Hai Peng Tan, Singapore (SG); Jian Guo Ma, Singapore (SG); Manh Anh Do, Singapore (SG); Kok Wai Johnny Chew, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/519,427

(22) Filed: Mar. 6, 2000

(51) Int. Cl.$^7$ .............................................. H01L 21/20
(52) U.S. Cl. ..................... 438/381; 257/531; 336/223
(58) Field of Search ........................ 257/531, 752; 438/329, 24, 57, 381; 336/222–223, 232; 333/140

(56) References Cited

U.S. PATENT DOCUMENTS

| | | | |
|---|---|---|---|
| 5,372,967 A | 12/1994 | Sundaram et al. | 437/60 |
| 5,576,680 A | 11/1996 | Ling | 336/200 |
| 5,612,660 A * | 3/1997 | Takimoto | 336/200 |
| 5,884,990 A | 3/1999 | Burghartz et al. | 336/200 |
| 5,936,298 A | 8/1999 | Capocelli | 257/531 |
| 6,291,872 B1 * | 9/2001 | Wang et al. | 257/531 |

FOREIGN PATENT DOCUMENTS

| | | | |
|---|---|---|---|
| EP | 04237106 | 8/1992 | H01F/17/00 |
| EP | 0 883 183 A1 * | 12/1998 | H01L/27/01 |

* cited by examiner

*Primary Examiner*—Roy Potter
(74) *Attorney, Agent, or Firm*—George O. Saile; Rosemary L. S. Pike

(57) ABSTRACT

A new structure is provided for the creation of an inductor on the surface of a silicon semiconductor substrate. The inductor is of spiral design and perpendicular to the plane of the underlying substrate. Conductor line width can be selected as narrow or wide, ferromagnetic material can be used to fill the spaces between the conductors of the spiral inductor. The spiral inductor of the invention can further by used in series or in series with conventional horizontal inductors.

23 Claims, 14 Drawing Sheets

INTEGRATED VERTICAL SPIRAL INDUCTOR ON SEMICONDUCTOR MATERIAL

BACKGROUND OF THE INVENTION (1) Field of the Invention

The invention relates to the fabrication of integrated circuit devices, and more particularly, to a method and structure for creating a high Q inductor while simultaneously reducing the surface space that is consumed by such an inductor. The inductor of the invention is a spiral inductor that is positioned in a plane that is perpendicular to the plane of the substrate on which the conductor is created.

(2) Description of the Prior Art

Modern semiconductor technology requires the creation of high performance semiconductor devices that are produced at competitive prices. A direct result of these requirements is that device density and inter-device packaging density continue to increase from which directly follows the requirement that the surface area or space that is available on the surface of a semiconductor substrate is carefully allocated and maximized in its use.

While the majority of semiconductor devices relate to the field of digital data processing, electronic circuitry can nevertheless be divided into two broad fields. One field addresses digital processing while the second field addresses the manipulation of analog signals. Digital semiconductor devices have as function the manipulation or storage of digital information. The functions of analog electronic circuitry have in previous years typically been handled by separate components such as relatively large capacitors or relatively large inductors. The separate components may have been applied in combination with digital processing capabilities, whereby however a significant portion of the functional implementation has been realized by the use of for instance capacitive and inductive components in addition to and functionally collaborating with the digital components. Circuit requirements that are imposed on components that are required for analog processing have in the past limited the integration of such components into typical semiconductor integrated circuit devices.

Modern mobile communication applications center around compact high-frequency equipment. With the continued improvements in the performance characteristics of this equipment, continued emphasis will be placed on small size of the equipment, low power consumption, increased frequency applications and low noise levels. Semiconductor devices are used in the field of mobile communication for the creation of Radio Frequency (RF) amplifiers. A major component of a typical RF amplifier is a tuned circuit that contains inductive and capacitive components. The tuned circuit has as electrical characteristic that, dependent on and determined by the values of its inductive and capacitive components, can form an impedance that is frequency dependent, which enables the tuned circuit to either form a high or a low impedance for signals of a certain frequency. In this manner the tuned circuit can either reject or pass and further amplify components of an analog signal based on the frequency of that component. The tuned circuit can therefore be used as a filter to filter out or remove signals of certain frequencies or to remove noise from a circuit configuration that is aimed at manipulating analog signals. The tuned circuit can also be used to form a high electrical impedance by using the LC resonance of the circuit and to thereby counteract the effect of parasitic capacitances that are part of a circuit. The self-resonance that is caused by the parasitic capacitance between the (spiral) inductor and the underlying substrate will limit the use of the inductor at high frequencies.

One of the key components that is applied in creating high frequency analog semiconductor devices is the inductor that forms part of a LC resonance circuit. The key challenge in the creation of the inductor is to minimize the surface area that is required for the creation of the inductor while maintaining a high Q value for the inductor. Conventional inductors that are created on the surface of a substrate are of a spiral shape, whereby the spiral is created in a plane that is parallel with the plane of the surface of the substrate. Conventional methods that are used to create the inductor on the surface of a substrate suffer several limitations. Most high Q inductors form part of a hybrid device configuration or of Monolithic Microwave Integrated Circuits (MMIC's) or are created as discrete components, the creation of which is not readily integratable into a typical process of Integrated Circuit manufacturing.

By combining the creation on one semiconductor monolithic substrate of circuitry that is aimed at the function of analog data manipulation and analog data storage with the functions of digital data manipulation and digital data storage, a number of significant advantages are achieved. Such advantages include the reduction of manufacturing costs and the reduction of power consumption by the combined functions. To reach required inductive values for particular applications, inductors can be of significant physical size and can therefore require a significant surface area of the semiconductor substrate. To limit this impact of space requirement, inductors are typically formed on the surface of a substrate in a spiral form. The spiral form of the inductor however results in parasitic capacitances between the inductor wiring and the underlying substrate, due to the physical size of the inductor. These parasitic capacitances have a serious negative effect on the functionality of the created LC circuit by sharply reducing resonance frequency of the tuned circuit of the application.

Widely used in the industry to describe the applicability of a created inductor is the Quality (Q) factor of the inductor. The quality factor Q of an inductor is defined as follows: $Q=Es/El$ wherein Es is the energy that is stored in the reactive portion of the component while El is the energy that is lost in the reactive portion of the component. The higher the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component, which can be degraded due to parasitics. In an actual configuration, there are always some physical resistors that will dissipate power, thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit to about 10 the quality factor that can be achieved for the inductor using the conventional silicon process. This limitation is, for many applications, not acceptable. Dependent on the frequency at which the LC circuit is designed to resonate, significantly larger values of quality factor, such as for instance 100 or more, must be available. Prior Art has in this been limited to creating values of higher quality factors as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly, thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like. Wireless communications is a rapidly expanding market, where the integration of RF integrated circuits is one of the most important challenges. One of the approaches is to significantly increase the frequency of operation to for instance the range of 10 to 100 GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

The incorporation of RF inductors without sacrificing device performance due to substrate losses has been extensively researched in recent years. Some of the techniques that have been used for this approach include:
  the selective removing (by etching) of the silicon underneath the inductor (using methods of micro-machining) thereby removing substrate parasitic effects
  using multiple layers of metal (such as aluminum) interconnects or of copper damascene interconnects
  using a high resistivity silicon substrate thereby reducing resistive losses in the silicon substrate, since resistive substrate losses form a dominant factor in determining the Q value of silicon inductors
  using metals that are particularly adaptable to the process of the formation of inductors, a concern is thereby however raised by the use of AlCu (a metal that is frequently used in semiconductor metallization) since AlCu has higher resistivity than gold (Au) metallization that is frequently used in GaAs technology
  employing biased wells underneath a spiral conductor
  inserting various types of patterned ground shields between the spiral inductor and the silicon substrate, and
  creating an active inductive component that simulates the electrical properties of an inductor as it is applied in active circuitry; this approach however results in high power consumption by the inductor and in noise performance that is unacceptable for low power, high frequency applications.

The above listing of researched alternatives is not meant to be complete or all inconclusive. The above approaches have as common objectives to:
  1) enhance the quality (Q) value of the inductor
  2) increase the frequency of the LC self-resonance thereby increasing the frequency range over which the inductor can be used, and
  3) reduce the surface area that is required for the creation of the inductor.

The inductor of the invention addresses the objectives that have been listed above and provides for a method of creating an inductor that sharply reduces the surface area that is required for the inductor. The method of the invention creates a vertical spiral inductor, which has performance characteristics that differ sharply from the performance characteristics of a typical spiral inductor that is created in a plane that is parallel with the surface of the substrate. The vertical spiral inductor of the invention uses current processes of multilevel interconnect to create the return patterns of the spiral, the return patterns are vertical with respect to the plane of the surface of the substrate. The electromagnetic field of the vertical return sections of the spiral inductor limit the resistive losses that are typically obtained in the silicon substrate since the electromagnetic field of these return sections is essentially parallel to the surface of the substrate and does therefore not penetrate the substrate. In addition, the surface area that is required for the creation of the inductor is sharply reduced due to its vertical construction, that is vertical with respect to the plane of the surface of the substrate.

FIG. 1a shows a top view of a Prior Art horizontal spiral inductor 25. Some of the design parameters of conductor 25 are highlighted as follows:
  10 is the body of the inductor and contains a conductive material
  11 is one extremity of the conductive body 10 of the inductor 25 and is, for convenience sake and arbitrarily, referred to as the beginning of the conductive body 10 of the inductor
  12 is a conductive connector that connects to the beginning 11 of the conductive body 10 of the inductor 25,
  13 is the opposing extremity of the conductive body 10 of the inductor 25 and will be referred to as the end of the conductive body of the inductor
  14 is a contact via that interconnects metal strip 12 with the conductive body 10 of the inductor
  16 is the spacing between the spirals of the conductive body 10 of inductor 25
  18 is the width of the spirals of the conductive body 10 of inductor 25
  20 is the length of the longest spiral of the conductive body 10 of inductor 25, and
  22 is the length of the shortest spiral of the conductive body 10 of inductor 25.

The top view of the Prior Art inductor that is shown in FIG. 1 is not shown in order to highlight in extensive detail all the parameters that can be associated with such an inductor but merely serves to point out the essence of the Prior Art inductor, that is:
  the geometric shape of the inductor is that of a spiral
  the individual sections that make up the spiral of the inductor alternately intersect at an angle of 90 degrees and have a length and a width and are separated by a spacing the spiral that forms the inductor ends in two extremities, the inductor is electrically interconnected to surrounding circuitry by being connected to these two extremities, and the body of the inductor is contained in a plane that is parallel to the plane of the surface of the substrate on which the inductor is created.

Not shown in FIG. 1 is the height of each of the linear segments that collectively form the body of the inductor 10, this height can be defined as the thickness of the conductive layer that is deposited on the surface of the substrate for the formation of the inductor. The lower surface of the inductor is the surface of the inductor that is parallel to the surface of the substrate and that is closest to the surface of the substrate, the upper surface of the inductor is the surface of the inductor that is parallel to the surface of the substrate and that is furthest removed from the surface of the substrate. The distance between the upper surface and the lower surface of the inductor as measured in a direction that is perpendicular to the plane of the substrate is the height of the inductor. A cross section of the inductor that is taken in a plane between the upper and the lower surface of the inductor shows the geometric shape of the inductor, which is the shape of a spiral. The height of the inductor of Prior Art is essentially the same along the spiral of the inductor.

U.S. Pat. No. 5,936,298 (Capocelli coil. teaches process for a Helix coil.

U.S. Pat. No. 5,576,680 (Ling) Structure and fabrication process of inductors on semiconductor chip, shows a vertical coil. See FIGS. 3e through 4c. Also a helix coil with a core.

U.S. Pat. No. 5,372,967 (Sundram)—Method for fabricating a vertical trench inductor, shows a vertical trench coil process.

U.S. Pat. No. 5,884,990 (Burghartz et al.) shows another vertical coil process.

SUMMARY OF THE INVENTION

A principle objective of the invention is to reduce the surface area that is required for the creation of an inductor on the surface of a silicon semiconductor substrate.

Another objective of the invention is to create an inductor on the surface of a silicon semiconductor substrate whereby the electromagnetic field of the inductor has sharply reduced resistive losses induced by the underlying substrate.

In accordance with the objectives of the invention a new method and structure is provided for the creation of an inductor on the surface of a silicon semiconductor substrate. The inductor is of spiral design, whereby the plane of a cross section of the inductor that reflects the spiral design of the inductor is perpendicular to the plane of the underlying substrate. The first embodiment of the invention provides a method of creating a vertical spiral inductor with thin conductor width. The second embodiment of the invention provides a method of creating a vertical spiral inductor with thin conductor width whereby ferromagnetic material is incorporated in the creation of the inductor. The third embodiment of the invention provides a method of creating a vertical spiral inductor with wide conductor width. The fourth embodiment of the invention provides a method of creating a vertical spiral inductor with wide conductor width whereby ferromagnetic material is incorporated in the creation of the inductor. The fifth embodiment of the invention provides two vertical spiral inductors that are connected in series. The sixth embodiment of the invention provides two vertical spiral inductors that are connected in series whereby ferromagnetic material is incorporated in the creation of the inductor. The seventh embodiment of the invention provides for the creation of a vertical spiral inductor that has a construction of protruding spirals. The eighth embodiment of the invention provides for the creation of a vertical spiral inductor that is combined with a horizontal spiral inductor whereby ferromagnetic materials are incorporated in the creation of the vertical inductor whereby the horizontal spiral inductor is overlaying the vertical spiral inductor. The ninth embodiment of the invention provides for the creation of a vertical spiral inductor that is combined with a horizontal spiral inductor whereby ferromagnetic materials are incorporated in the creation of the vertical inductor whereby the horizontal spiral inductor is in the plane of the top surface of the vertical spiral inductor.

BRIEF DESCRIPTION OF THE DRAWINGS

FIG. 2 addresses a vertical inductor of the invention that uses thin conductor width, as follow:

FIG. 3 addresses a vertical inductor of the invention that uses small conductor width whereby furthermore ferromagnetic material is incorporated, as follow:

FIG. 6 addresses a vertical inductor of the invention whereby two vertical spiral inductors are connected in series, as follow:

FIG. 8 addresses an inductor of the invention whereby the spirals of the inductor protrude from the vertical plane of the inductor, as follows:

FIG. 9 addresses an inductor of the invention whereby a conventional horizontal spiral inductor is combined with a vertical spiral inductor of the invention whereby the horizontal inductor overlays the vertical inductor, as follows:

FIG. 10 addresses an inductor of the invention whereby a conventional horizontal spiral inductor is combined with a vertical spiral inductor of the invention whereby the horizontal inductor is located in the plane of the top layer of the vertical inductor, as follows:

DESCRIPTION OF THE PREFERRED EMBODIMENTS

The process of the invention will be highlighted by concentrating on the geometric and constructional details of the creation of the inductor of the invention. Processing steps that are required to implement these structural details will not be highlighted for reasons of simplicity while in addition these processing steps are well established in the art. Among these processing steps are steps of depositing layers of dielectric and the patterning and etching of openings in these layers of dielectric whereby these openings are aligned with underlying patterns. To include these processing steps in the description of the inventions would require the entry of state of the art conditions of deposition, patterning and etching that would make the current document unnecessarily cumbersome while not providing added value that relates to the process of the invention.

Referring now specifically to FIG. 2, FIGS. 2a through 2d address a vertical inductor of the invention that uses small conductor width.

Figure 2A:
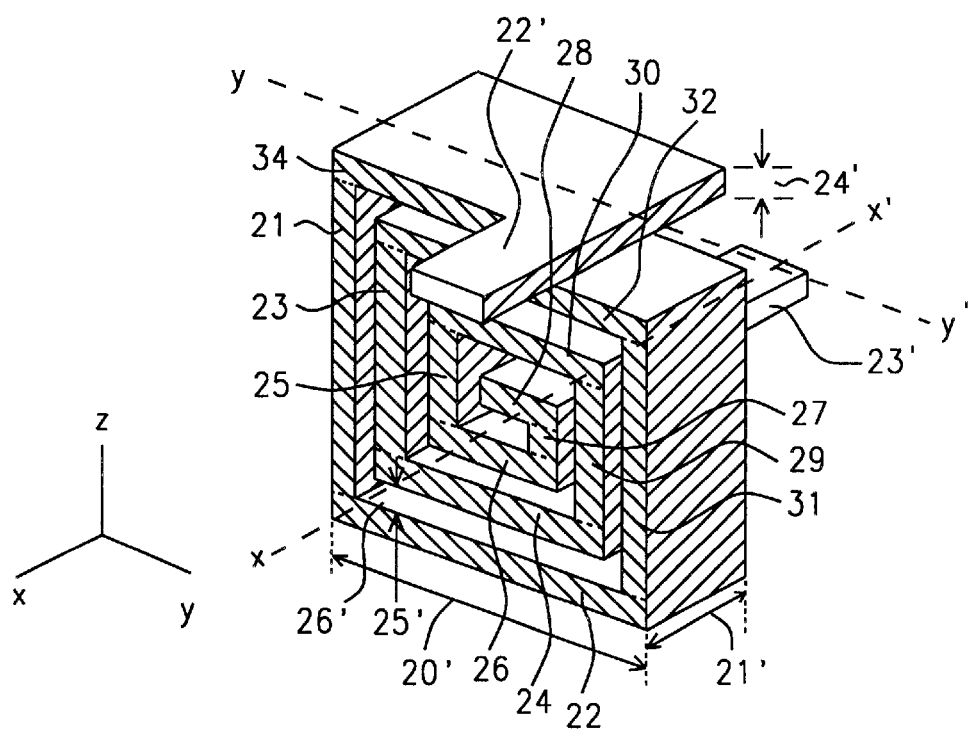
FIG. 2a is a right hand extended three-dimensional view of the vertical inductor of the invention with a small conductor width.

FIG. 2a is a right hand extended three-dimensional view of the vertical inductor of the invention with a small conductor width.

Figure 1:
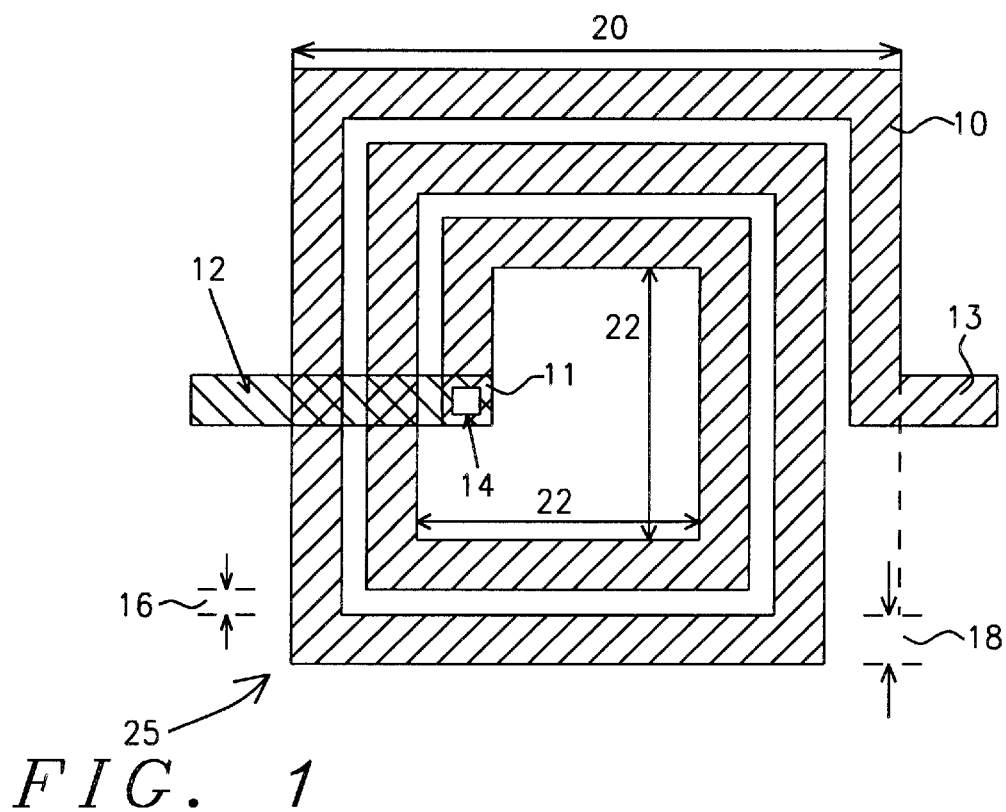
FIG. 1 shows a top view of a Prior Art horizontal spiral conductor.

In order to facilitate the following discussions, the familiar concept of three-dimensional Cartesian coordinates is briefly discussed with an emphasis on how these coordinates will be used for the subject discussion. The Cartesian coordinates as used herein have three axis, the X, Y and Z-axis whereby the angle between each of the three axis and the other two axis is 90 degrees. The X and Y axis are in a plane that is parallel with the surface of the substrate on which the inductor will be formed, the Z axis is therefore perpendicular to the plane of the substrate. The three axis of the Cartesian coordinates intersect in one point, which is considered the geometric center of the Cartesian coordinates.

Where the spiral of the Prior Art inductor that has been shown in FIG. 1 is contained in a plane that is parallel to the surface of the substrate, the spiral of the inductor of the invention is in a plane that is perpendicular to the surface of the substrate. This means that the body of the inductor has been rotated by 90 degrees, which alters the meaning of the concept of inductor height that has been highlighted in FIG. 1 for the Prior Art inductor. That parameter of FIG. 1 now becomes, due to the 90 degrees rotation of the plane of the inductor, the thickness of the layer of conductive material that is used to create the inductor. This will become apparent by a close examination of the three dimensional view of the inductor of the invention that is shown in FIG. 2a. The three Cartesian coordinates that have previously introduced are shown in the lower left-hand corner of FIG. 2a. It is readily apparent from FIG. 2a that a cross section of the inductor taken in a plane that is parallel to the Y-Z plane indicates the spiral form of the inductor of the invention whereby the spiral is in a plane that is perpendicular to the surface of the substrate. The surface of the substrate on which the inductor is being formed is parallel with the plane in which the X-Y axis resides.

The parameters that are of importance to the three dimensional view that is shown in FIG. 2a are the following:

the horizontal conductors of the vertical spiral inductor have been numbered using even numbers, starting with the lowest layer and starting with the number 22, these horizontal conductors are therefore in sequence conductors 22, 24, 26, 28, 30, 32 and 34 the vertical conductors of the vertical spiral inductor, also referred to as the connecting conductors, have been numbered using uneven numbers, starting with the left most conductor and starting with the number 21, these horizontal conductors are therefore in sequence conductors 21, 23, 25, 27, 29, and 31

20' is the length of the lower layer 22 of the conductive material that forms the body of the inductor 21' is the width of the lower layer 22 of the conductive material that forms the body of the inductor 22' is the first of two connectors to the body of the inductor 23' is the second of two connectors to the body of the inductor 24' is the thickness of the conductive material that forms the body of the inductor 25' is the distance between adjacent layers of conductive material, and 26' is the dielectric that is deposited between the adjacent layers of conductive material.

The layer 22 is the first layer that is created in a layer of dielectric. The technology that is used to create layer 22 is the conventional technology that is used to create interconnect lines in a layer of dielectric. Layer 22 may be created directly on the surface of a substrate or may be created on the surface of a layer of dielectric (not shown in FIG. 2a) that has first been deposited on the surface of a substrate. If a layer of dielectric is deposited before the layer 22 is formed in a second layer of dielectric, the body of the inductor is further removed from the underlying silicon substrate thereby reducing resistive losses that are suffered by the electromagnetic field of the inductor. This reduction is however not as pronounced as a similar reduction that can be achieved for the inductor of Prior Art since the electromagnetic field of the inductor of the invention that is shown in FIG. 2a is essentially parallel to the surface of the underlying substrate and therefore does not intersect to a significant degree with that surface.

Of importance to the process of the invention is the creation of the first or lowest layer of the connecting vias 21 and 31. After layer 22 has been formed as indicated above, a second layer of dielectric is deposited over the surface of layer 22, this second layer of dielectric is patterned such that openings for the lower sections of the connecting conductors 21 and 31 (on both extremities of the layer 22 and covering the layer 22 over its width 21') are formed in the second layer of dielectric. The second layer of dielectric has a thickness that essentially equals the distance 25' between layer 22 and the overlying layer 24. The process is then continued by the deposition of a third layer of dielectric, this third layer of dielectric as patterned and etch creating openings for layer 24 and for extensions of the connecting conductors 21 and 31 that overlay the first openings that have been created in the second layer of dielectric for the connecting conductors 21 and 31. This process is repeated, creating increasingly smaller openings for the horizontal conductors. The spiral shaped body of the inductor can in this manner be created, after the level of the spiral of the inductor that is created in this manner is higher than the center of the spiral of the inductor, the horizontal conductors increase in size to form the upper part of the spiral, all the while creating overlaying openings for the connecting conductor vias. Input/output connectors 22' and 23' are created in similar manner and in the desired locations of the inductor using the same processing steps of dielectric depositions (to form the spacings between the conductors of the inductive spiral) and dielectric patterning for the conductors and the connecting conductor vias.

The small conductor width of the invention is a width 21' (FIG. 2a) that is between about 4 and 6 times the height of layer 22, FIG. 2a.

In further addressing the method in which the vertical spiral inductor of the invention is created, it is important to differentiate between a number of sections of the inductor, as follows:

1) the lower horizontal conductor 22 is created first and as indicated above, no steps of repetition are involved in the creation of layer 22

2) once the lower horizontal conductor 22 has been created, the lower section of the inductor is created where the lower section of the inductor is the section that is between the surface of layer 22 and below vertical interconnect 27. This process of creating the lower section is a repetitive cycle whereby horizontal conductors of decreasing length are created overlaying layer 22 while at the same time creating vias for the extension of the vertical conductors 21, 23, 29 and 31

3) after the lower section has been created, the first input/output connector 28 is created by creating the vertical interconnect 27 (which connects the first I/O connector 28 to the spiral of the vertical inductor) after which the first I/O connector 28 is created 4) after the first I/O connector has been created, the upper section of the inductor is created where the upper section is the section that is located between the surface of the first I/O connector 28 and the top surface of the last horizontal conductor 32. This process of creating the upper section is a repeat process whereby horizontal conductors of increasing length are created that overlay the first I/O connector 28 while at the same time creating vias that serve as extensions of vertical conductors. The process of creating the upper section of the helix coil uses the creation of dual damascene patterns where the trench of the dual damascene pattern forms a horizontal conductor while the vias of the dual damascene patterns form the extended vertical conductors 5) after the upper section has been completed, the second I/O connector 34 is created by depositing a layer of dielectric, creating an opening in this layer of dielectric that is used to connect the second I/O connector to the remaining vertical conductor 21 that is up to this point as yet not connected, depositing a second layer of dielectric and patterning and etching the second I/O connector 34 in this second layer of dielectric.

From the above it is clear that some of the processing cycles for the creation of the vertical spiral are one time cycles while others lead themselves to repetition to the point where certain sections of the inductor have been completed.

It is further of interest to notice that the view of the vertical inductor that is shown in FIG. 2a is a right hand view of the inductor. From this it follows that vertical conductors can be differentiated between right hand vertical conductors and left-hand vertical conductors. For instance, vertical conductor 31 is a right-hand vertical conductor that overlays the surface of layer 22 on a right-hand vertical contact area in the surface of layer 22, vertical conductor 21 is a left-hand vertical conductor that overlays the surface of layer 22 on a left-hand vertical contact area in the surface of layer 22. It is finally interesting to note that the coil-like nature of the inductor becomes clear best by starting with the first I/O connector 28 and from there following the alternating vertical and horizontal conductors in a clockwise rotation until the second I/O connector 34 is reached.

Figure 2B:
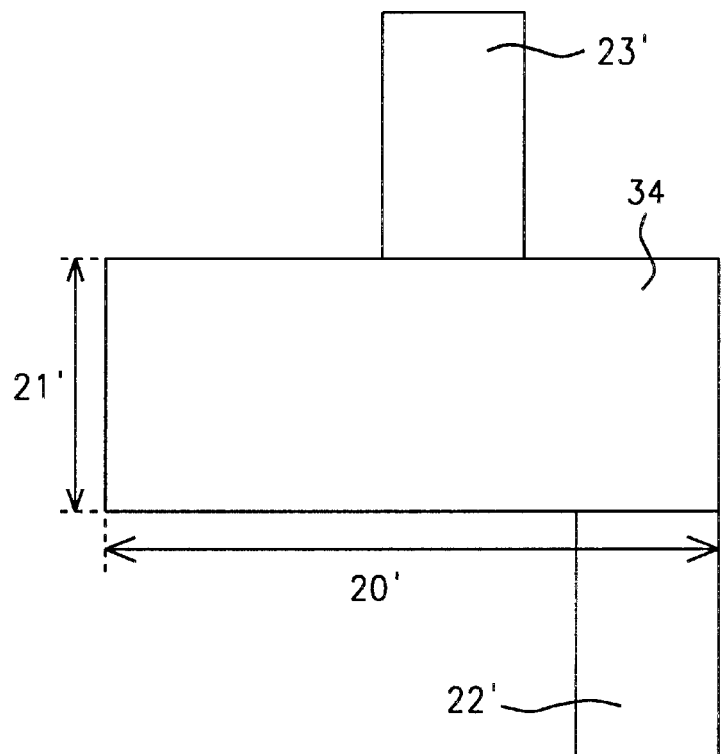
FIG. 2b shows a top view the vertical inductor of the invention with a small conductor width.

FIG. 2b shows a top view the vertical inductor of the invention with a thin conductor width. The top view is taken in the direction of the Z-axis, that is looking down in the direction of the substrate, thereby looking down on plane 34 of FIG. 2a. In such a top view, the I/O connectors 22' and 23' are visible as indicated in FIG. 2b.

Figure 2C:
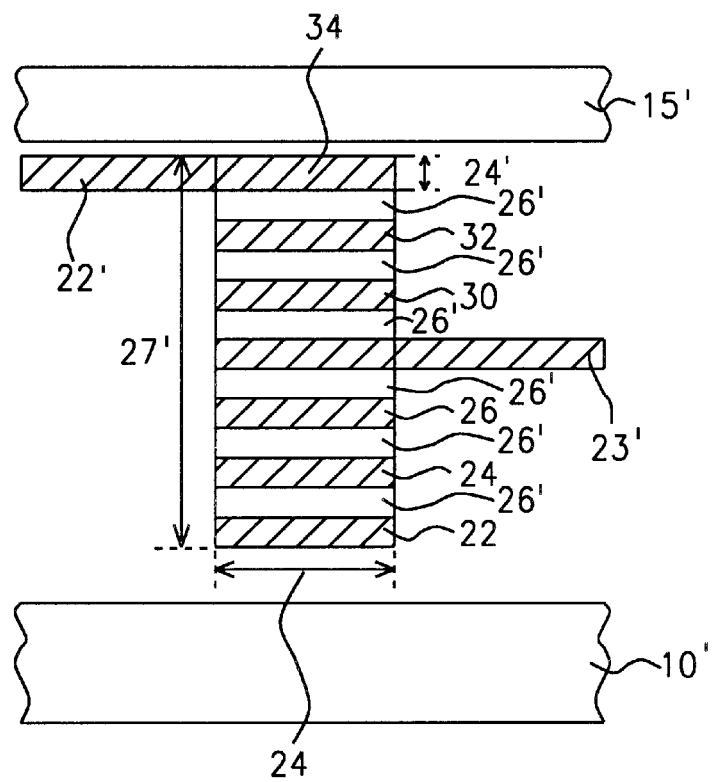
FIG. 2c shows a cross section in an Y-direction of the vertical inductor of the invention with a small conductor width.

FIG. 2c shows a side view taken in the Y-direction (that is looking at the X-Z plane of FIG. 2a) of the spiral inductor of the invention. The side view that is shown highlights not only the I/O interconnects 22' and 23' but also shows a cross section of the conductive layers and the connecting conductor vias that have previously been indicated in FIG. 2a and that form the inductor of the invention. The conductor height 27' is also indicated. Underlying the body of the vertical inductor of the invention is the silicon substrate 10', a layer 15' of passivation material is deposited over the surface of the completed vertical inductor of the invention.

Figure 2D:
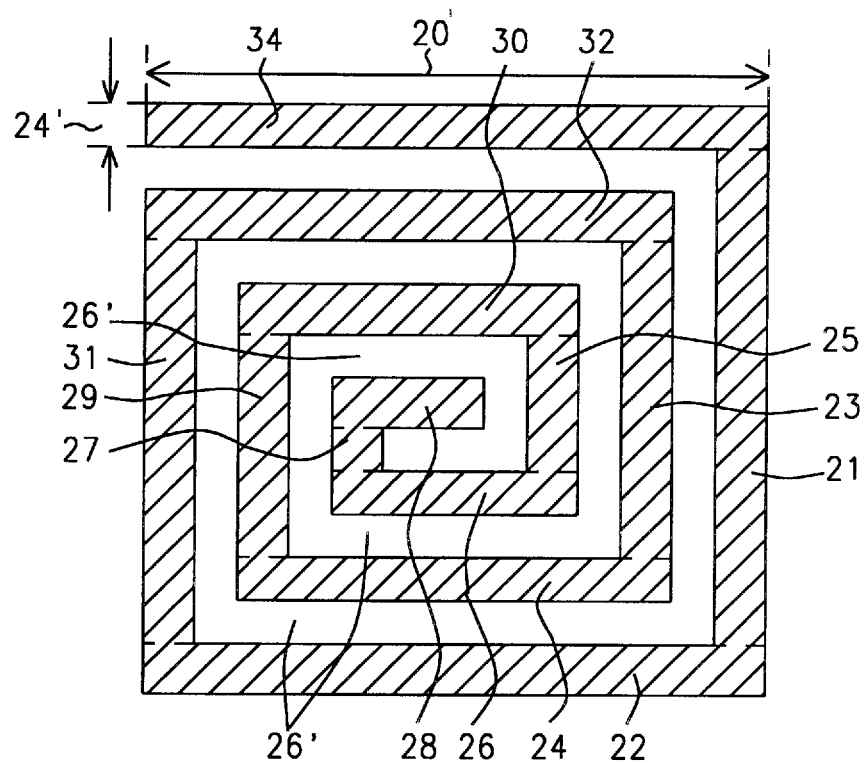
FIG. 2d shows a cross section in a Z-direction of the vertical inductor of the invention with a small conductor width.

FIG. 2d shows a top view taken in the Z-direction (that is looking at the X-Y plane of FIG. 2a) of the spiral inductor of the invention. The regions that are highlighted in FIG. 2d have previously been identified including the dielectric 26' that is present between the conductive material that forms the body of the inductor. Layer 22 is the lower horizontal conductor, layer 34 is the upper horizontal conductor. Layer 28 is the inner conductor.

FIG. 3 addresses a vertical inductor of the invention that uses small conductor width whereby furthermore ferromagnetic material is incorporated. The views of the spiral inductor of the invention that are shown in FIGS. 3a through 3d are therefore essentially the same as the views of the spiral inductor of the invention that have been shown as FIGS. 2a through 2d with the exception of the addition of the layer 36 of ferromagnetic material.

Figure 3A:
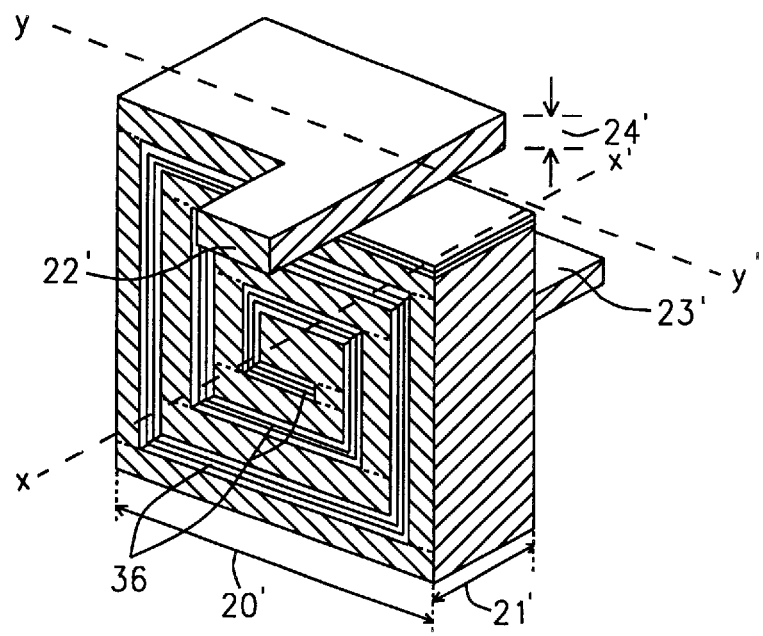
FIG. 3a is a right hand extended three-dimensional view of the vertical inductor of the invention with a small conductor width whereby ferromagnetic material is incorporated.

FIG. 3a is a right hand extended three-dimensional view of the vertical inductor of the invention with a thin conductor width whereby ferromagnetic material 36 is incorporated. The same numbering scheme and related designations that have been shown in FIG. 2a apply to FIG. 3a with the exception of the parameter 36 for the added ferromagnetic material.

Figure 3B:
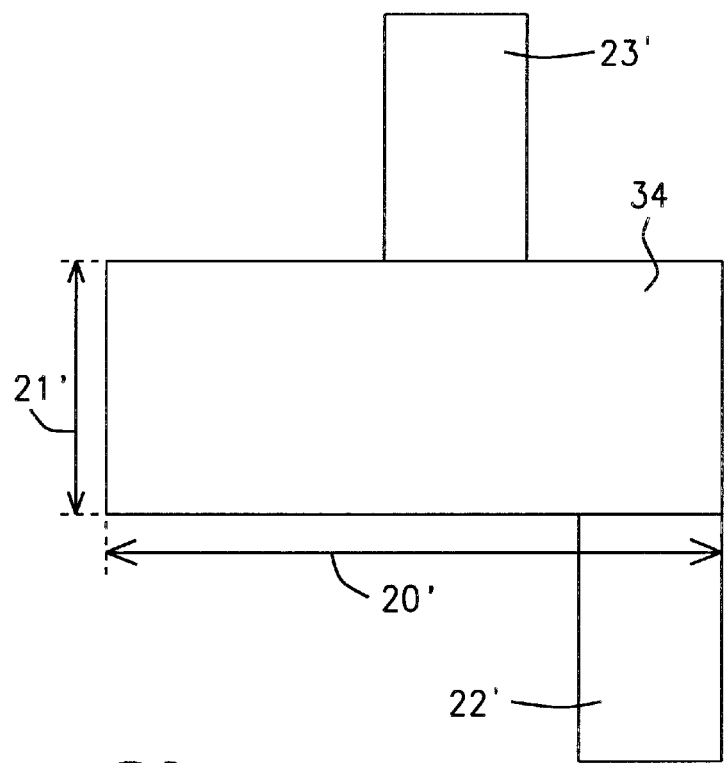
FIG. 3b shows a top view the vertical inductor of the invention with a small conductor width whereby ferromagnetic material is incorporated.

FIG. 3b shows a top view the vertical inductor of the invention with a thin conductor width whereby ferromagnetic material 36 is incorporated.

Figure 3C:
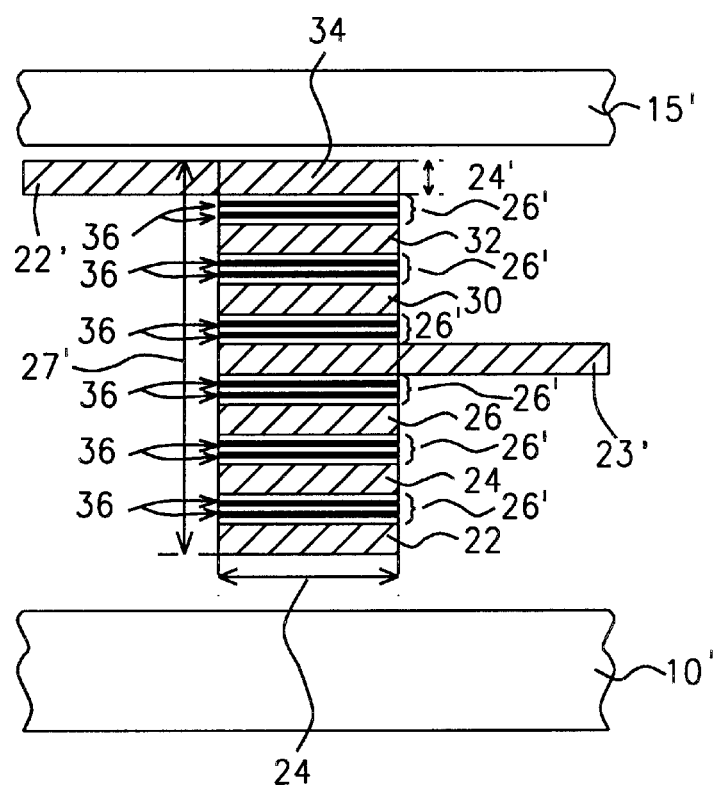
FIG. 3c shows a cross section in an X-direction of the vertical inductor of the invention with a small conductor width whereby ferromagnetic material is incorporated.

FIG. 3c shows a cross section in an X-direction of the vertical inductor of the invention with a thin conductor width whereby ferromagnetic material 36 is incorporated. The same numbering scheme and related designations that have been shown in FIG. 2c apply to FIG. 3c with the exception of the parameter 36 for the added ferromagnetic material.

Figure 3D:
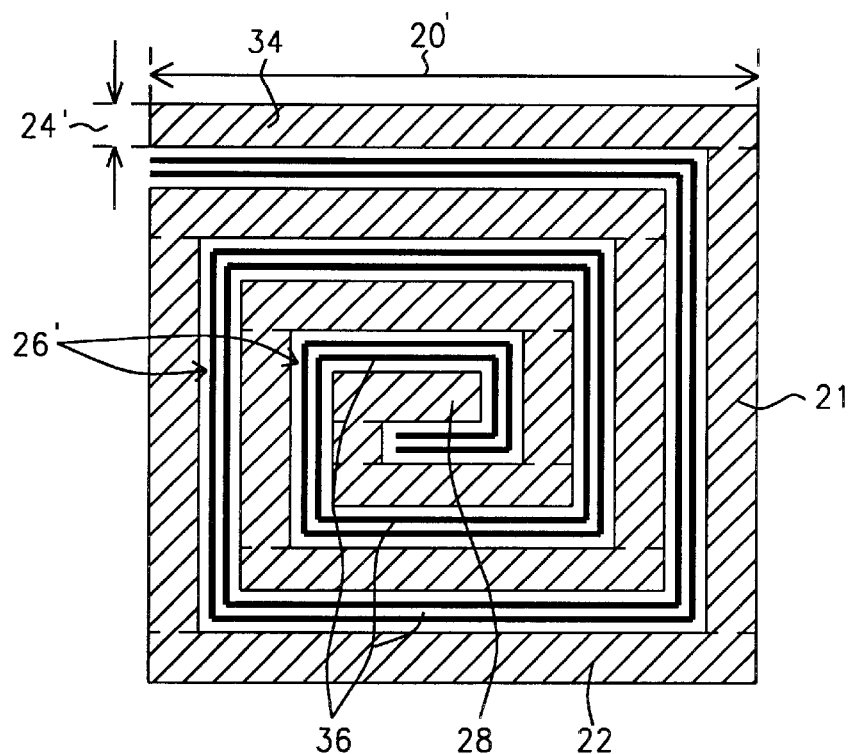
FIG. 3d shows a cross section in an Y-direction of the vertical inductor of the invention with a small conductor width whereby ferromagnetic material is incorporated.

FIG. 3d shows a cross section in an Y-direction of the vertical inductor of the invention with a thin conductor width whereby ferromagnetic material is incorporated.

Figure 4:
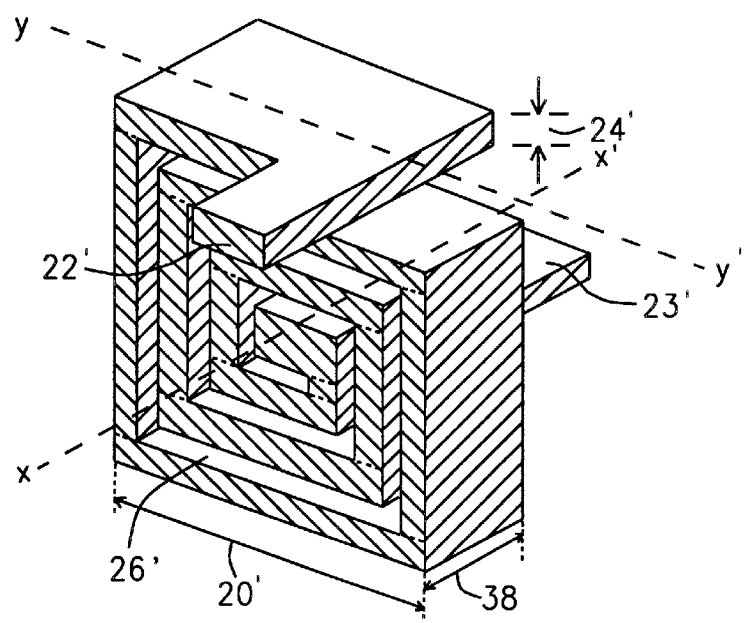
FIG. 4 is a right hand extended three-dimensional view of the vertical inductor of the invention with a large conductor width.

FIG. 4 is a right hand extended three-dimensional view of the vertical inductor of the invention with a large conductor width. The artwork that relates to the third embodiment of the invention is essentially identical to the artwork that has been shown as FIGS. 2a through 2d, the same numbering scheme and related designations that have been shown in FIG. 2a apply to FIG. 4 with the exception of the parameter 38. The essential difference between the vertical spiral of the invention that is shown in FIG. 4 is that the conductor width 38 of FIG. 4a is considerably larger than the conductor width 21' that is shown in FIG. 2a. This increase in conductor width has as effect that the electromagnetic field of the vertical spiral inductor is further concentrated resulting in improved performance of Q factor, inductance and performance at higher frequencies, even though these improvements are achieved at the cost of a slightly increased surface area that is required for the creation of the vertical spiral inductor of the third embodiment of the invention.

Figure 5:
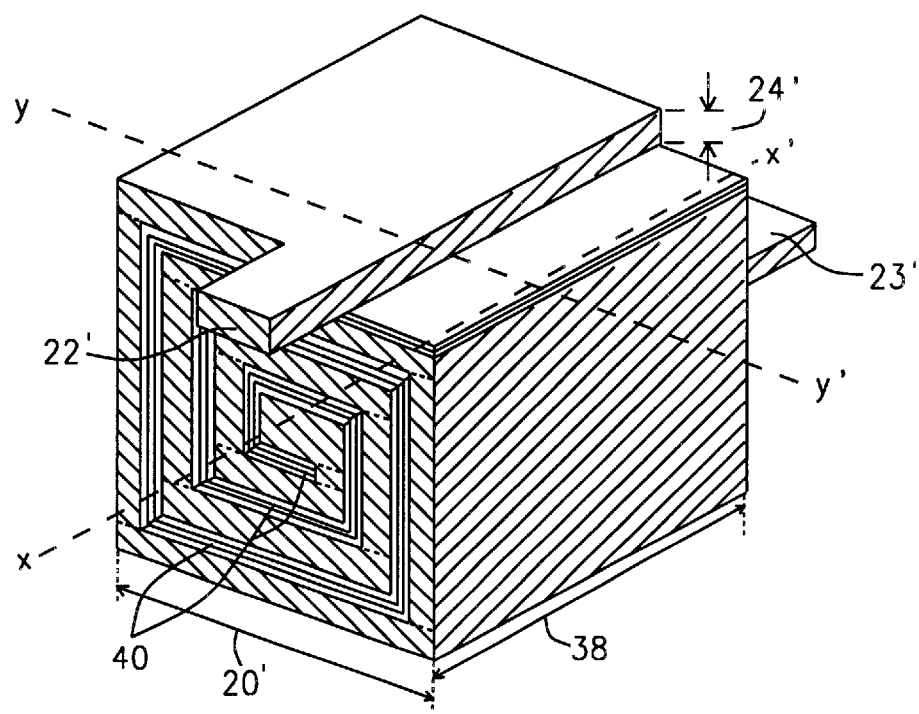
FIG. 5 is a right hand extended three-dimensional view of the vertical inductor of the invention with a large conductor width whereby ferromagnetic material is incorporated.

The device configuration of the vertical spiral inductor of the invention that is shown in FIG. 5 is identical to the configuration that is shown in FIG. 4 with the exception of the addition of ferromagnetic material 40 to the inductor. The ferromagnetic material is interposed between physically adjacent layers of the spiral construction and completely or partially takes the place of the dielectric 26' of FIG. 4.

FIG. 6 addresses the fifth embodiment of the invention, which is a vertical inductor of the invention whereby two vertical spiral inductors are connected in series. The construction of each of the two vertical spiral inductors can follow either the first embodiment of the invention, whereby narrow conductor width is used, or the second embodiment of the invention, whereby narrow conductor width with the incorporation of ferromagnetic material is used or the third embodiment of the invention, whereby wide connector width is used of the fourth embodiment of the invention, whereby wide conductor width with the incorporation of ferromagnetic materials is used.

Figure 6A:
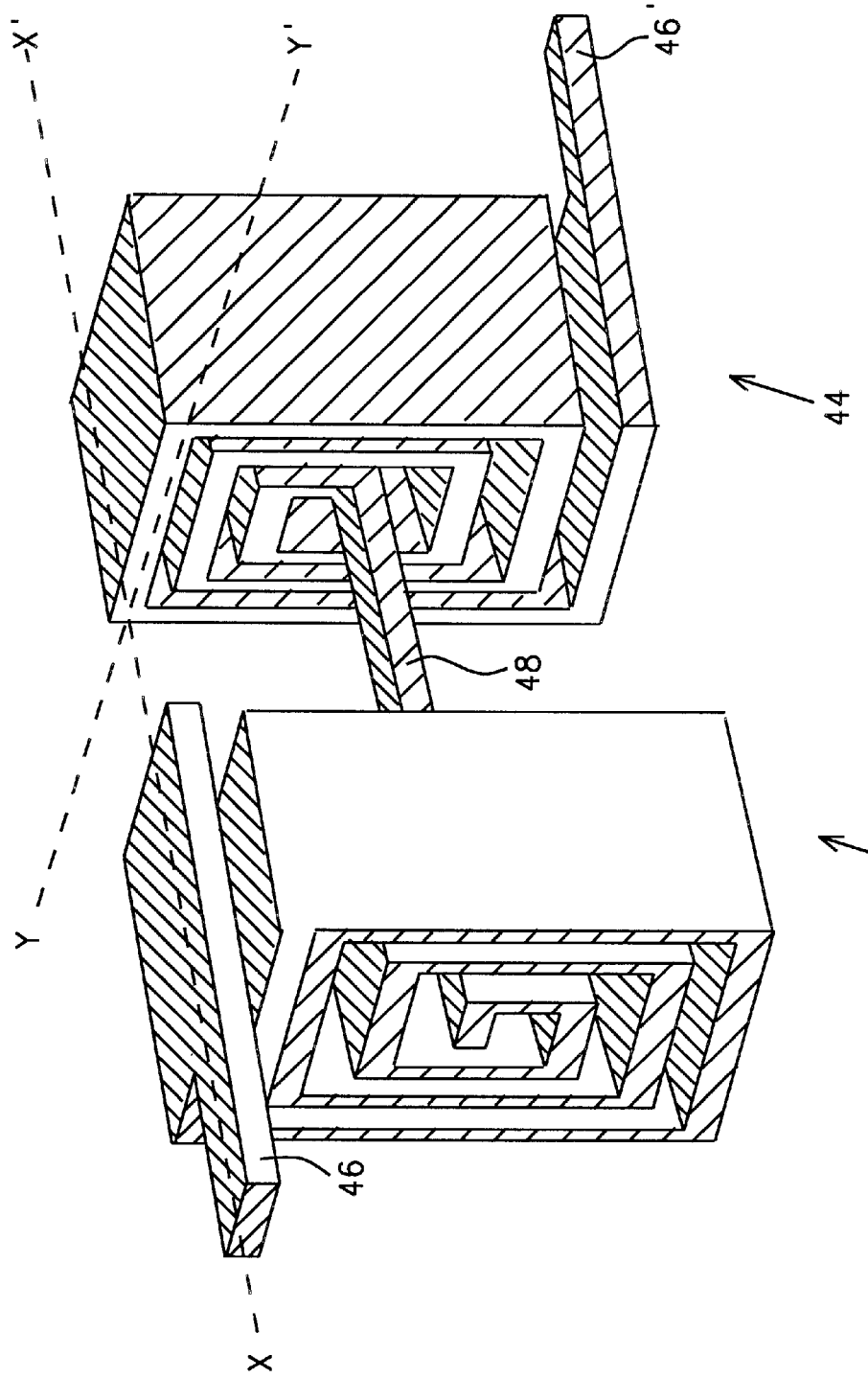
FIG. 6a is a right hand extended three-dimensional view of vertical inductor of the invention whereby two vertical spiral inductors are connected in series.

FIG. 6a is a right hand extended three-dimensional view of vertical inductor of the invention whereby two vertical spiral inductors are connected in series. The first vertical inductor 42 is connected to the second vertical inductor 44 by means of the series connector 48. The input and output connections to the two vertical spiral inductors is provided by the connectors 46 and 46'.

Figure 6B:
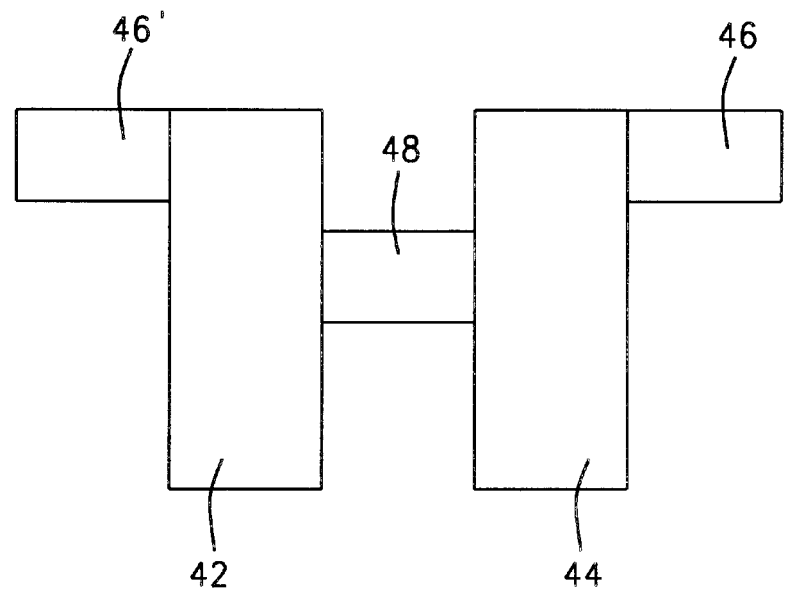
FIG. 6b shows a top view the vertical inductor of the invention whereby two vertical spiral inductors are connected in series.

FIG. 6b shows a top view the vertical inductor of the invention whereby two vertical spiral inductors are connected in series. The various components that make up the subject construction have previously been highlighted and are highlighted in FIG. 6b.

Figure 6C:
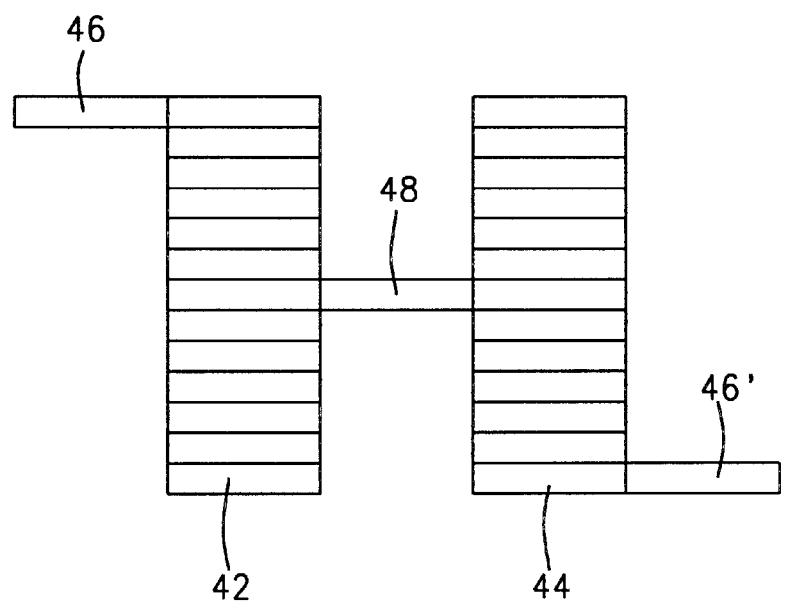
FIG. 6c shows a cross section in an X-direction of the vertical inductor of the invention whereby two vertical spiral inductors are connected in series.

FIG. 6c shows a cross section in an X-direction of the vertical inductor of the invention whereby two vertical spiral inductors are connected in series. The various components that make up the subject construction have previously been highlighted and are highlighted in FIG. 6c.

Figure 6D:
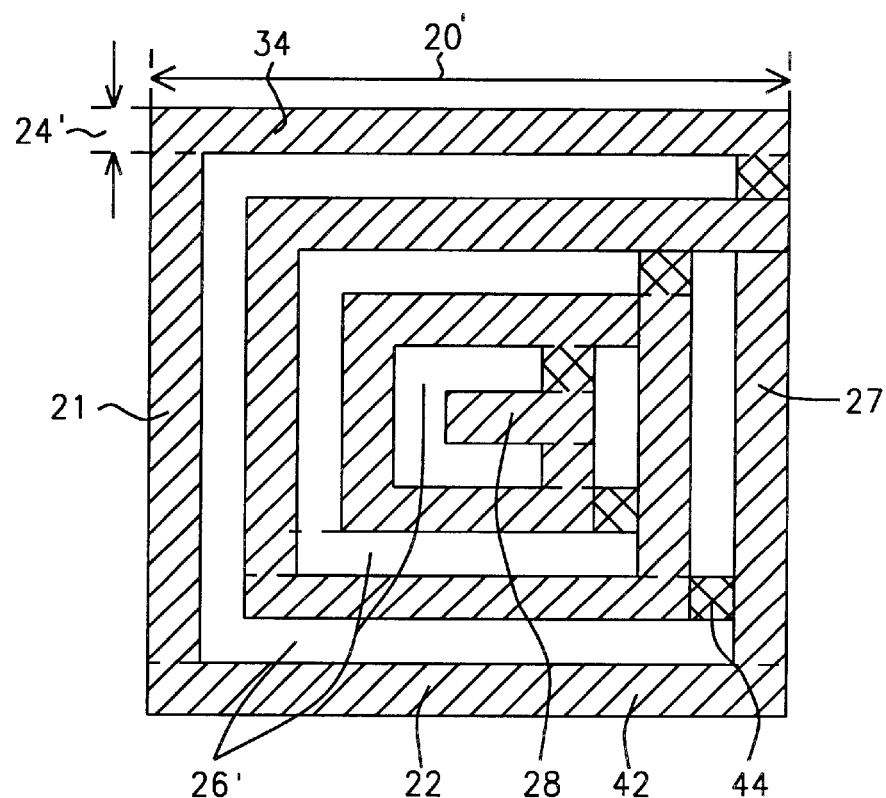
FIG. 6d shows a cross section in an Y-direction of the vertical inductor of the invention whereby two vertical spiral inductors are connected in series.

FIG. 6d shows a cross section in an Y-direction of the vertical inductor of the invention whereby two vertical spiral inductors are connected in series.

Figure 7:
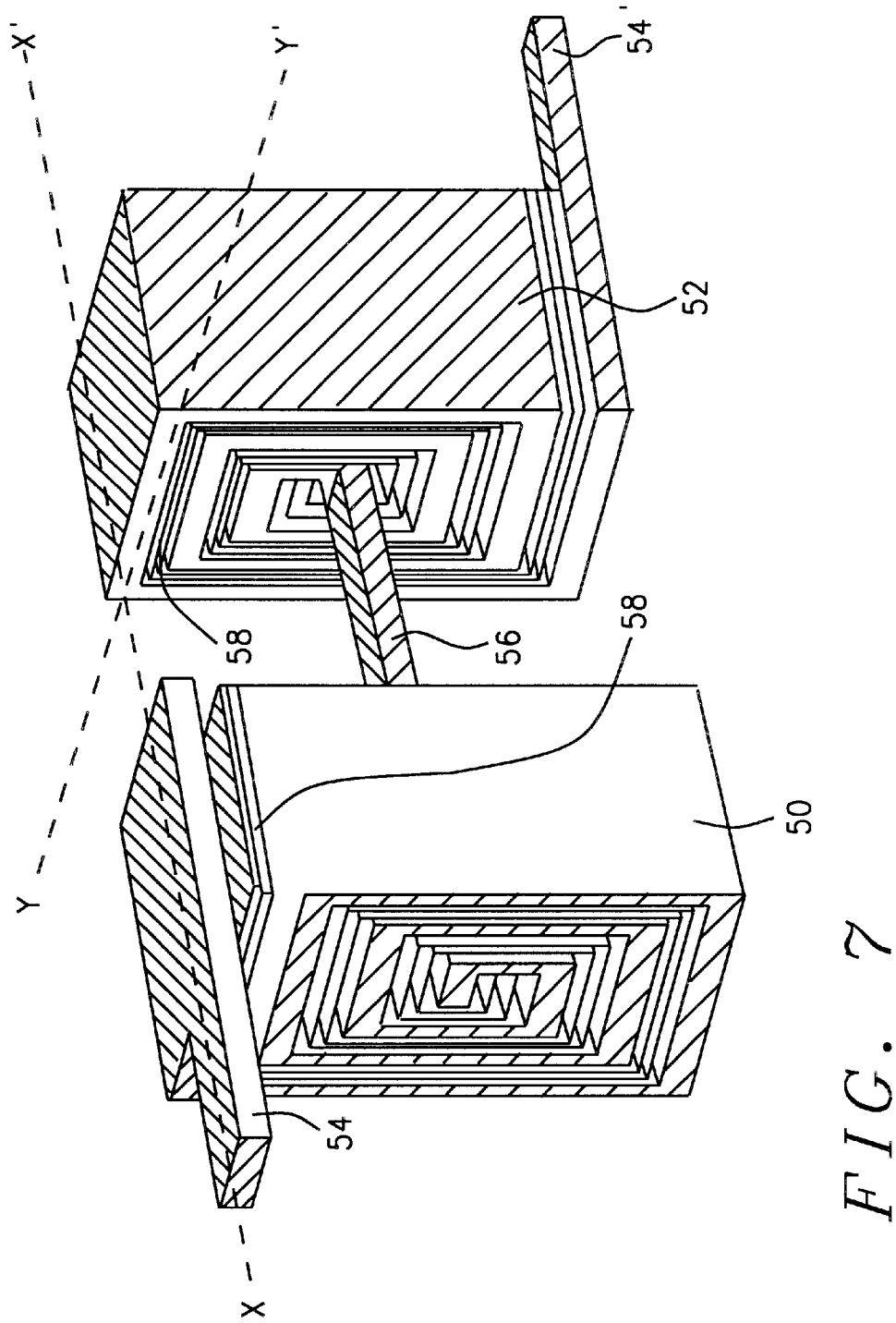
FIG. 7 is a right hand extended three dimensional view of vertical inductor of the invention whereby two vertical spiral inductors are connected in series whereby furthermore ferromagnetic material is incorporated.

FIG. 7 is a right hand extended three dimensional view of vertical inductor of the invention whereby two vertical spiral inductors are connected in series whereby furthermore ferromagnetic material is incorporated. The first vertical spiral inductor 50 is connected to the second vertical spiral inductor 52 by means of the series connector 56. Input/output connectors to the two vertical spiral inductors is provided by connectors 54 and 54'. Multi-layer ferromagnetic material that has been incorporated into each of the two vertical spiral connectors is labeled 58.

FIG. 8 addresses the seventh embodiment of the invention, that is an inductor of the invention whereby the spirals of the inductor protrude from the vertical plane of the inductor. This construction of the vertical spiral inductor further amplifies the magnetic field that is concentrated around the geometric center of the inductor, thereby increasing the Q value of the inductor.

Figure 8A:
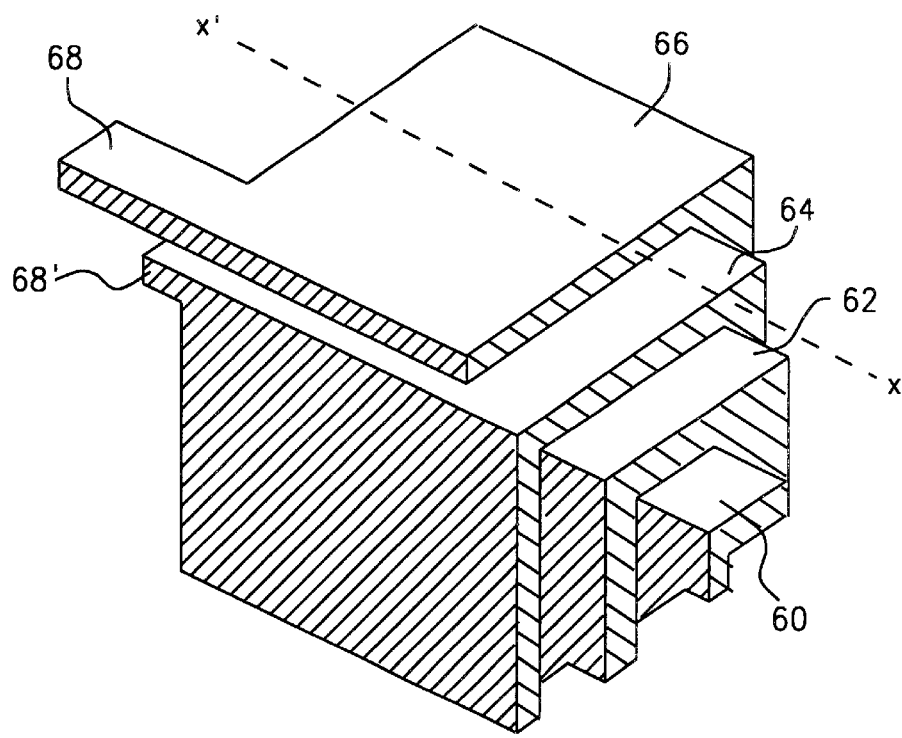
FIG. 8a shows an expanded three-dimensional front side view of a vertical inductor of the invention whereby the spirals of the inductor progressively protrude from the body of the inductor.

FIG. 8a shows an expanded three-dimensional front side view of a vertical inductor of the invention whereby the spirals of the inductor progressively protrude from the body of the inductor. The protruding layers of the vertical inductor are labeled 60, 62 and 64 whereby the protruding feature can be observed by noticing that significant surface areas of these layers are not aligned with the top surface 66 but extend from the body of the vertical spiral inductor by a measurable amount.

Figure 8B:
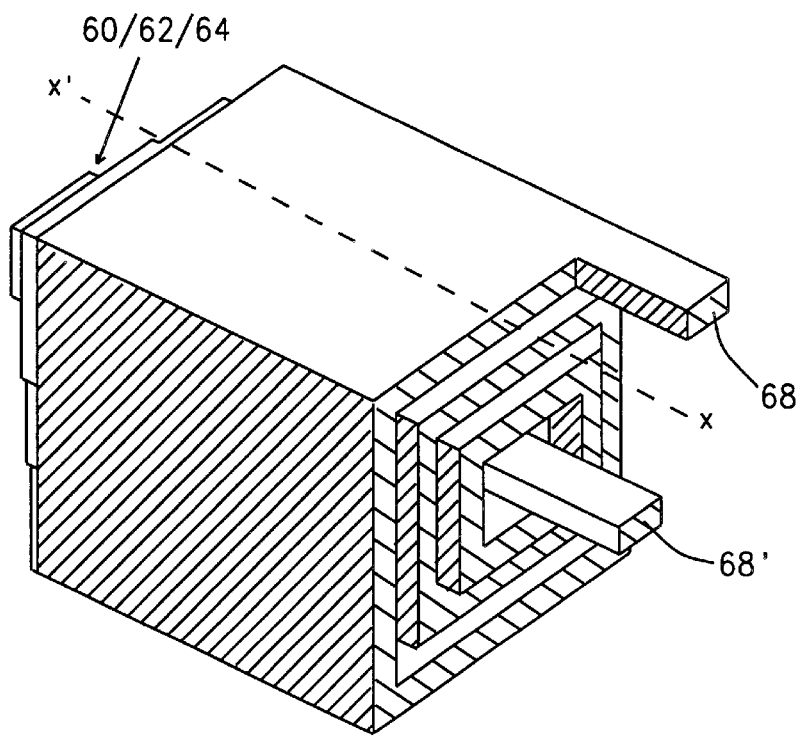
FIG. 8b shows an expanded three-dimensional backside view of a vertical inductor of the invention whereby the spirals of the inductor progressively protrude from the body of the inductor.

FIG. 8b shows an expanded three-dimensional backside view of a vertical inductor of the invention whereby the spirals of the inductor progressively protrude from the body of the inductor. The protruding turns of the spiral inductor are now essentially hidden from view by the body of the vertical spiral inductor, the input/output connectors 68/68' are clearly visible.

Figure 8C:
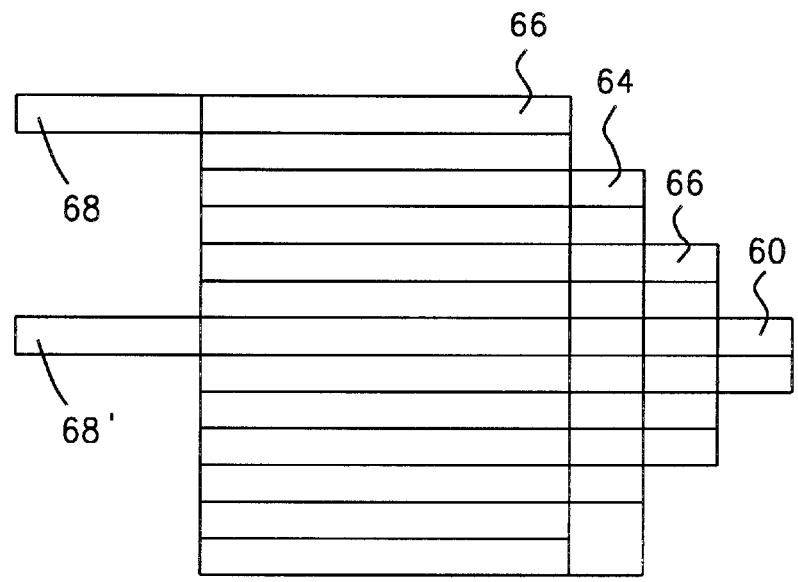
FIG. 8c shows a cross section in an X-dimension of a vertical inductor of the invention whereby the spirals of the inductor progressively protrude from the body of the inductor.

FIG. 8c shows a cross section in an X-dimension of a vertical inductor of the invention whereby the spirals 64, 66 and 68 of the inductor progressively protrude from the body of the inductor.

FIG. 9 addresses an inductor of the invention whereby a horizontal spiral inductor is combined with a vertical spiral inductor whereby the horizontal inductor overlays the vertical inductor.

Figure 9A:
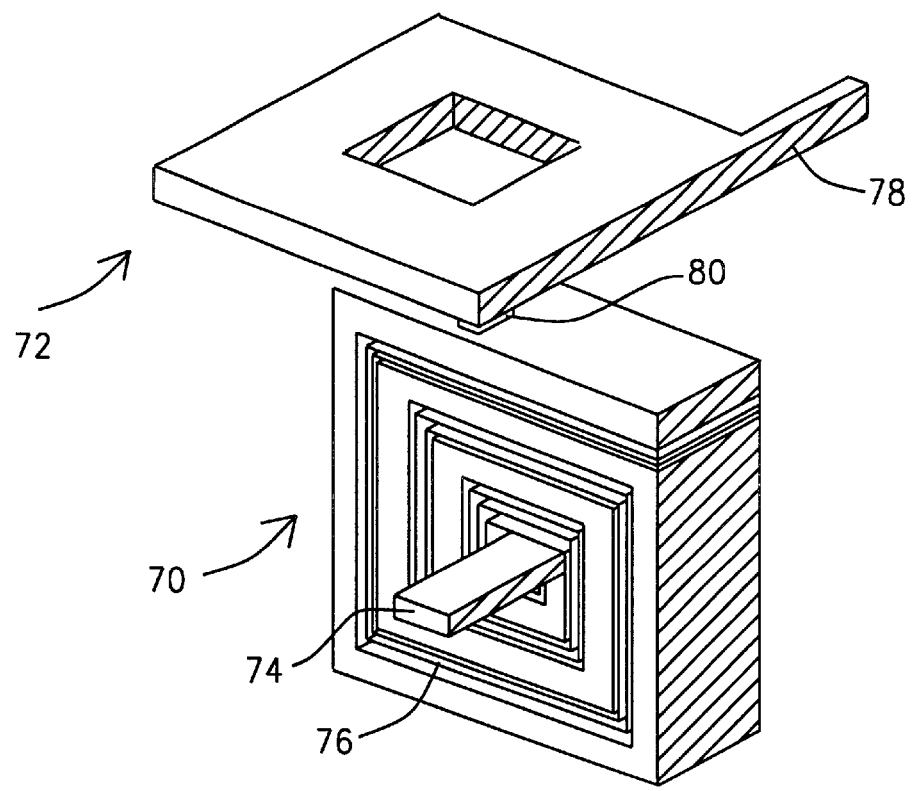
FIG. 9a shows a three-dimensional expanded right hand view of an inductor of the invention whereby a horizontal spiral inductor is connected in series with a vertical spiral inductor.

FIG. 9a shows a three-dimensional expanded right hand view of an inductor 70 of the invention whereby a horizontal spiral inductor 72 is connected in series with a vertical spiral inductor. Further shown in FIG. 9a are the input/output connection points 74 for the vertical inductor, the layers 76 of ferromagnetic material that has been inserted between the spirals of the inductor, the input/output connection points 78 for the horizontal inductor 72 and the point 80 of interconnect between the vertical inductor 70 and the horizontal inductor 72.

Figure 9B:
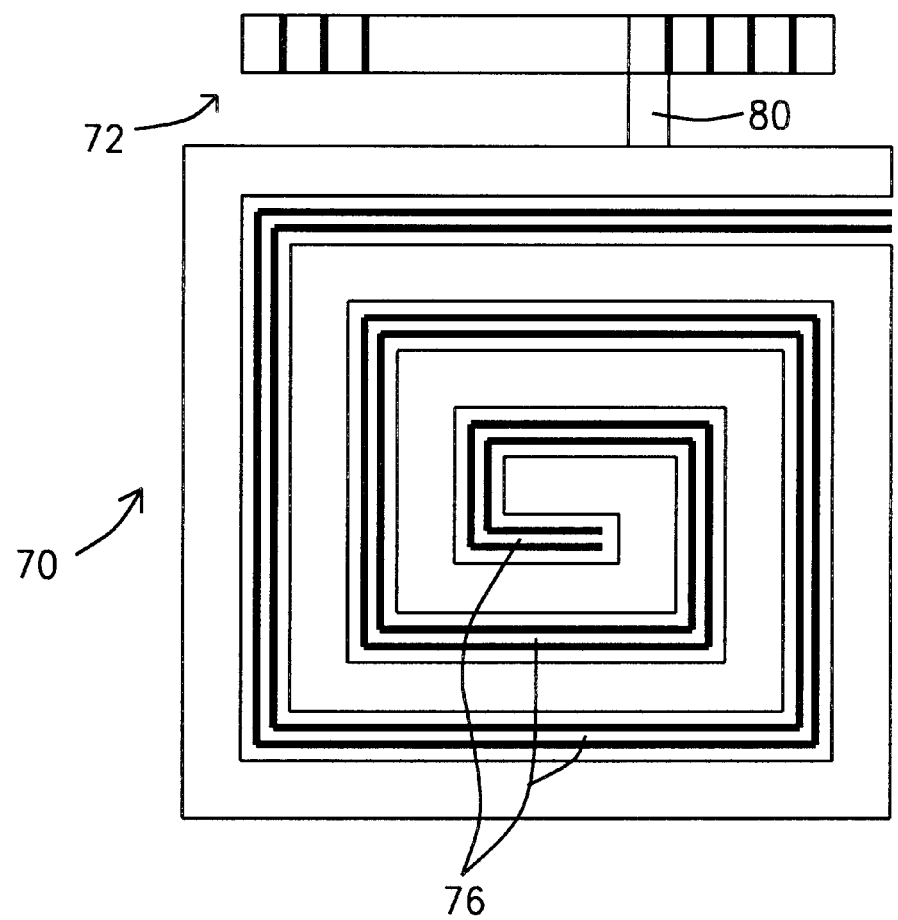
FIG. 9b shows a cross section taken in a plane that is perpendicular with the surface of the underlying substrate of an inductor of the invention whereby a horizontal spiral inductor is connected in series with a vertical spiral inductor.

FIG. 9b shows a cross section taken in a plane that is perpendicular with the surface of the underlying substrate of an inductor of the invention whereby a horizontal spiral inductor 72 is connected in series with a vertical spiral inductor 70.

Figure 10A:
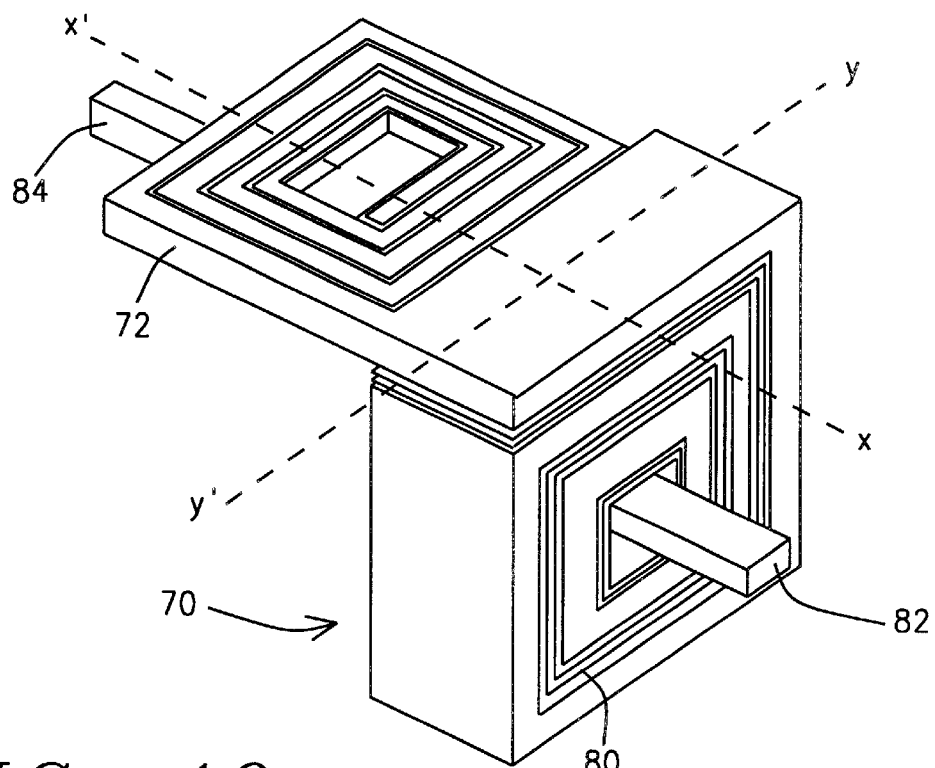
FIG. 10a shows a three dimensional expanded right hand view of an inductor of the invention whereby a horizontal spiral inductor is connected in series with a vertical spiral inductor whereby furthermore the horizontal inductor is located in the plane of the top layer of the vertical inductor.

FIG. 10 addresses an inductor of the invention whereby a horizontal spiral inductor is combined with a vertical spiral inductor whereby the horizontal inductor is located in the plane of the top layer of the vertical inductor, as follows:

FIG. 10a shows a three dimensional expanded right hand view of an inductor 70 of the invention whereby a horizontal spiral inductor 72 is connected in series with a vertical spiral inductor whereby furthermore the horizontal inductor is located in the plane of the top layer of the vertical inductor. Input/output connections 84 for the horizontal spiral inductor 72 are indicated as are input/output connections 82 for the vertical spiral inductor 70 of the invention.

Figure 10B:
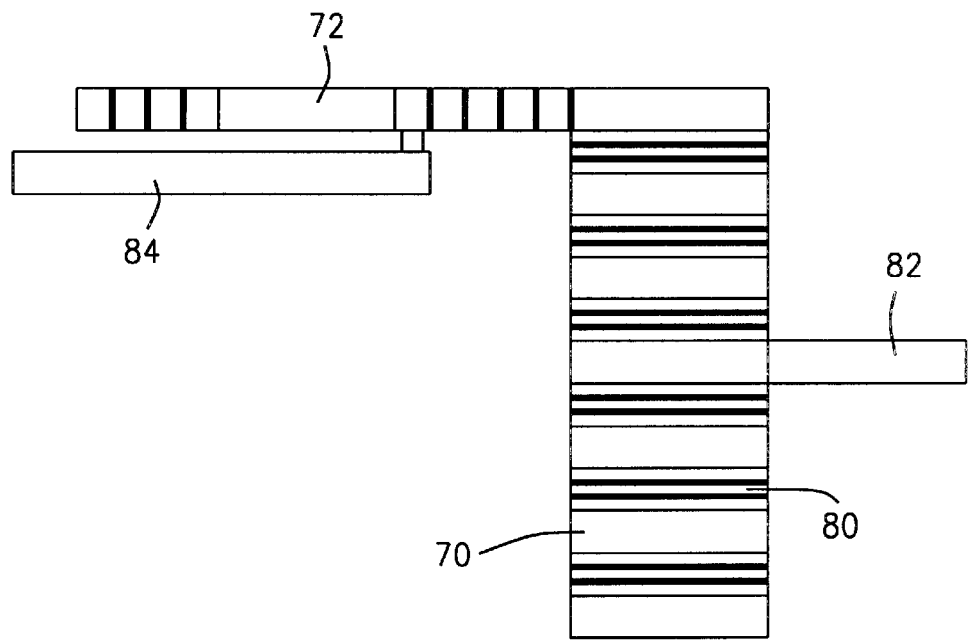
FIG. 10b shows a cross section taken in an X-direction in a plane that is perpendicular with the surface of the underlying substrate of an inductor of the invention whereby a horizontal spiral inductor is connected in series with a vertical spiral inductor whereby furthermore the horizontal inductor is located in the plane of the top layer of the vertical inductor.

FIG. 10b shows a cross section taken in an X-direction in a plane that is perpendicular with the surface of the underlying substrate of an inductor 70 the invention whereby a horizontal spiral inductor 72 connected in series with a vertical spiral inductor 70 whereby furthermore the horizontal inductor 72 is located in the plane of the top layer of the vertical inductor.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a vertical spiral inductor containing horizontal and vertical conductors of a width Wc, said width having a direction separated by spacing further containing a first and a second input/output connector, said vertical spiral inductor containing a body that is bounded by a base horizontal conductor, two outer vertical conductors and said second input/output connector, whereby said vertical spiral inductor can be viewed in a direction of width that is parallel with said surface of said substrate resulting in a horizontal view one of said inductor, comprising the steps of:

providing a semiconductors substrate, said substrate having a surface;

depositing a base layer of dielectric having a surface over said surface of said substrate;

creating a base section of said vertical spiral inductor having a surface further having a height Hb and a width Wc, said base section being created on said surface of said base layer of dielectric;

creating a lower section of said vertical spiral inductor having a height Hl, said lower section being created overlying said surface of said base section;

creating a first input/output connector section having a height Hfio further having a surface, said first input/output section being created on said surface of said lower section;

creating an upper section of said vertical spiral inductor having a surface further having a height Hu, said upper section being created on said surface of said first input/output section; and creating a second input/output connector section having a surface further having a height Hsio, said second input/output section being created on said surface of said upper section.

2. The method of claim 1 wherein said creating a base section of said vertical spiral inductor comprises the steps of:

depositing a first layer of dielectric having a surface over said surface of said base layer of dielectric;

patterning and etching said first layer of dielectric thereby creating a trench in said first layer of dielectric for a base horizontal conductor;

depositing a first layer of metal over said surface of said first layer of dielectric thereby filling said trench;

planarizing said first layer of metal down to said surface of said first layer of dielectric thereby creating a base horizontal conductor said base horizontal conductor having a surface, a length, a height, a width, a thickness and two surface areas that are a subset of said surface of said base horizontal conductor and that serve as vertical conductor contact areas that occupy opposite extremities of said surface of said base horizontal conductor in a direction of width over the width of said base horizontal conductor and in a direction of length that equals said thickness of said horizontal conductor whereby said vertical conductor contact areas can be divided into a right most vertical contact area and a left most vertical contact area said division being derived at by facing said vertical spiral in a direction of width of said vertical spiral in a plane that is parallel to said plane of said substrate.

3. The method of claim 1 wherein said creating a lower section of said vertical spiral inductor comprises the steps of:

depositing a second layer of dielectric over said base section of said vertical spiral thereby including said planarized surface of said base horizontal conductor whereby a thickness of said second layer of dielectric equals said spacing between said horizontal and said vertical conductors;

patterning and etching said second layer of dielectric thereby creating openings in said second layer of dielectric that align with said vertical contact areas in said base horizontal conductor;

depositing a third layer of dielectric over said second layer of dielectric;

patterning and etching said third layer of dielectric thereby creating a trench in said third layer of dielectric that aligns with said base horizontal conductor said trench having a length whereby said length equals said length of said base horizontal conductor minus two times the combined value of said thickness of said vertical conductors and said gap between said vertical conductors in addition to creating openings in said third layer of dielectric that align with said vertical contact areas in said base horizontal conductor two vertical conductor contact areas when facing said vertical spiral is a direction of width of said horizontal conductors;

depositing a layer of metal over said surface of said third layer of dielectric thereby including said trench and said openings that have been created in said second and said third layer of dielectric;

planarizing said layer of metal that has been deposited over said surface of said third dielectric thereby creating partial vertical conductors overlaying said vertical conductor contact areas further creating a first horizontal conductor said first horizontal conductor having a height Hb further having a width Wc further containing two upper surface areas that serve as vertical contact areas that occupy opposite extremities of said surface of said first horizontal conductor in a direction of width over the width of said horizontal conductor and in a direction of length that equals said thickness of said horizontal conductor whereby said vertical conductor contact areas can be divided into a right most vertical contact area and a left most vertical contact area said division being derived at by facing said vertical spiral in a direction of width of said vertical spiral in a plane that is parallel to said plane of said substrate; and repeating previous steps starting with depositing a second layer of dielectric up through and including said planarizing said layer of metal that has been deposited over said surface of said third dielectric whereby for each repetition an additional horizontal conductor to a preceding horizontal conductor is created that aligns with said preceding horizontal conductor of height Hb and width Wc whereby a length for each additional horizontal conductor equals a length of said preceding horizontal conductor minus two times the combined value of said thickness of said vertical conductor and said gap between said vertical conductors while furthermore for each repetition two additional extensions are created in said second and third layer of dielectric that align with vertical conductor contact areas of underlying horizontal conductors said repetition being continued until the combined thickness of said second and third layer of dielectric equals said lower section height Hl.

4. The method of claim 1 wherein said creating said first input/output connector section comprises the steps of:

depositing a fourth layer of dielectric having a surface over said surface of said lower section;

patterning and etching said fourth layer of dielectric thereby creating an opening in aid fourth layer of dielectric that aligns with a rightmost vertical conductor contact area in a horizontal conductor that is exposed in said surface of said lower section of said vertical spiral conductor whereby said rightmost vertical conductor contact area is the rightmost of said two vertical conductor contact areas when facing said vertical spiral is a direction of width of said horizontal conductors where by said rightmost opening is the opening that aligns with said first input/output connector;

depositing a fifth layer of dielectric having a surface over said surface of said fourth layer of dielectric;

patterning and etching said fifth layer of dielectric thereby creating a trench in said fifth layer of dielectric in addition to creating openings that align with said underlying vertical contact areas of underlying horizontal conductors whereby said trench aligns and makes contact with said right most opening that has been created in said fourth layer of dielectric whereby furthermore said trench extends in said dimension of width of said horizontal conductors by a considerable amount;

depositing a layer of metal over said surface of said fifth layer of dielectric thereby including said trench and said openings that have been created in said fifth layer of dielectric; and planarizing said layer of metal that has been deposited over said surface of said fifth dielectric thereby creating a first input/output connector.

5. The method of claim 1 wherein said creating an upper section of said vertical spiral inductor is:

depositing a sixth layer of dielectric having a surface and a seventh layer of dielectric having a surface over said surface of said first input/output section of said vertical spiral inductor;

forming a dual damascene pattern in said sixth and seventh layer of dielectric said dual damascene pattern containing a left most via and a right most via and a trench connecting said left most via with said right most via whereby said trench of said dual damascene pattern is designed to contain a horizontal conductor whereby said vias align with innermost partially completed vertical conductors whereby furthermore said trench of said dual damascene pattern is bounded by said vias;

depositing a layer of metal over said surface of said seventh layer of dielectric thereby including said trench and said openings that have been created in said sixth and seventh layers of dielectric;

planarizing said layer of metal that has been deposited over said surface of said seventh layer of dielectric thereby creating a first horizontal conductor of said upper section of said vertical spiral inductor;

repeating said steps of depositing a sixth and seventh layer of dielectric thereby creating layers of horizontal conductors that align with said first input/output connector further having a length whereby said horizontal conductors are progressively further removed from said surface of said substrate whereby said length of said trench of said dual damascene pattern is adjusted such that the thereby created vias step wise expand from said innermost partially completed vertical conductors and further connect said horizontal conductors in said upper section of said vertical spiral with said horizontal conductor in said lower section in said vertical spiral in a spiral pattern said repetition being continued to the point where the total thickness of the aggregate deposits of sixth and seventh layer of dielectric equals said Hu at which point one vertical conductor remains unconnected at a lengthwise extremity of this conductor that is furthest removed from said surface of said substrate whereby said unconnected vertical conductor aligns with said left most vertical conductor connect area in said surface of said base horizontal conductor.

6. The method of claim 1 wherein said creating a second input/output connector section comprises the steps of:

depositing an eighth and ninth layer of dielectric having a surface over said surface of said upper section of said vertical spiral;

creating and etching a dual damascene pattern in said eight and ninth layer of dielectric whereby a via of said dual damascene pattern aligns with said unconnected remaining vertical conductor while furthermore a trench of said dual damascene pattern extends in said dimension of width of said horizontal conductors by a considerable amount;

depositing a layer of metal over said surface of said ninth layer of dielectric thereby including said via that has been created in said eighth layer of dielectric and said trench that has been created in said ninth layer of dielectric; planarizing said layer of metal down to said surface of said ninth layer of dielectric; and depositing a layer of passivation material over said surface of said ninth layer of dielectric thereby providing environmental protection for said vertical spiral.

7. The method of claim 1 wherein each of said horizontal conductors comprises:

a conductor length in a plane that is parallel to said surface of said substrate;

conductor sidewalls in a direction of said conductor length and in a plane that is perpendicular to said surface of said substrate henceforth referred to as lengthwise horizontal conductor sidewalls;

a conductor width in a plane that is parallel to said surface of said substrate whereby said conductor width is smaller than said conductor length;

conductor sidewalls in a direction of said conductor width and in a plane that is perpendicular to said surface of said substrate henceforth referred to as widthwise horizontal conductor sidewalls;

a conductor thickness in a plane that is perpendicular to said surface of said substrate;

a conductor upper surface in a plane that is parallel to said surface of said substrate whereby said conductor upper surface has a geometric shape of a rectangle whereby opposing corners of each of said rectangles can be connected with two lines that form diagonals of said rectangles whereby said diagonals have a point of intercept;

a conductor lower surface in a plane that is parallel to said surface of said substrate whereby said conductor lower surface has a geometric shape of a rectangle whereby opposing corners of each of said rectangles can be connected with two lines that form diagonals of said rectangles whereby said diagonals have a point of intercept; and vertical interconnect surface areas that occupy opposing extremities of either said conductor upper or lower surface of said horizontal conductor in a direction of width of said horizontal conductors whereby said vertical interconnect surface areas are used for establishing contact with said vertical connecting conductors.

8. The method of claim 1 wherein each conductor of said vertical connecting conductors comprises:

a conductor height in a plane that is perpendicular to said surface of said substrate;

a conductor width in a plane that is parallel to said surface of said substrate;

a conductor thickness in a plane that is parallel to said surface of said substrate;

a conductor cross section in a plane that is parallel to said surface of said substrate that has the shape of a geometric rectangle;

a conductor upper surface in a plane that is perpendicular to said surface of said substrate;

a conductor lower surface in a plane that is perpendicular to said surface of said substrate;

two conductor sidewalls that are parallel with the length of said a vertical connecting conductor henceforth referred to as lengthwise vertical conductor sidewalls; and two conductor sidewalls that are parallel with the width of said a vertical connecting conductor henceforth referred to as widthwise vertical conductor sidewalls.

9. The method of claim 1 wherein said conductor width is between about 4 and 10 times said conductor thickness.

10. The method of claim 1 wherein each step of patterning and etching to create openings and trenches in each of said layers of dielectric that are used in said vertical spiral inductor is preceded by the steps of:

patterning and etching said layer of dielectric whereby said patterning uses the mirror image pattern of a pattern that is used for patterning and etching to create openings and trenches in each of said layers of dielectric for said horizontal and vertical conductors whereby said mirror image pattern is bounded by said base horizontal conductor, said two outer vertical conductors and said second input/output connector, hereby creating openings and trenches in said layer of dielectric that are within said bounds of said vertical spiral and that are mirror image openings and trenches to said horizontal and vertical conductors;

filling said mirror image openings and trenches with a ferromagnetic material; and planarizing said ferromagnetic material.

11. The structure of claim 1 whereby two spiral inductors are connected in series.

12. The structure of claim 1 wherein said conductor width is between about 10 and 50 times the conductor thickness.

13. The method of claim 1 wherein each of said horizontal conductors thereby including said first and said second input/output connectors has a geometric shape of a rectangle whereby opposing corners of each of said rectangles can be connected with two lines that form diagonals of said rectangles whereby said diagonals have a point of intercept whereby said points of intercept for said closest spaced horizontal conductor and said furthest spaced horizontal conductors are located on as line that is perpendicular to said surface of said substrate and form a start and an end point of a line that interconnects said points of intercept of said diagonals of said horizontal conductors whereby said line is located in a plane that is perpendicular to said surface of said substrate said plane furthermore being parallel with said lengthwise sidewalls of said horizontal conductors whereby said line is non-linear thereby creating a spiral structure whereby spirals of said spiral inductor protrude from said body of said spiral inductor.

14. The method of claim 13 wherein said conductor width is between about 4 and 10 times said conductor thickness.

15. The method of claim 13 wherein each step of patterning and etching to create openings and trenches in each of said layers of dielectric that are used in said vertical spiral inductor is preceded by the steps of:

patterning and etching said layer of dielectric whereby said patterning uses the mirror image pattern of a pattern that is used patterning and etching to create openings and trenches in each of said layers of dielectric thereby creating mirror image openings and trenches;

filling said mirror image openings and trenches with a ferromagnetic material; and planarizing said ferromagnetic material.

16. The structure of claim 13 whereby two spiral inductors are connected in series.

17. The structure of claim 13 wherein said conductor width is between about 10 and 50 times the conductor thickness.

18. The method of claim 17 wherein each step of patterning and etching to create openings and trenches in each of said layers of dielectric that are used in said vertical spiral inductor is preceded by the steps of:

patterning and etching said layer of dielectric whereby said patterning uses the mirror image pattern of a pattern that is used patterning and etching to create openings and trenches in each of said layers of dielectric thereby creating mirror image openings and trenches;

filling said mirror image openings and trenches with a ferromagnetic material; and planarizing said ferromagnetic material.

19. The structure of claim 17 whereby two spiral inductors are connected in series.

20. The method of claim 1 wherein said creating said first input/output connector section comprises the steps of:

depositing a fourth layer of dielectric having a surface over said surface of said lower section;

patterning and etching said fourth layer of dielectric thereby creating an opening in aid fourth layer of dielectric that aligns with a leftmost vertical conductor contact area in a horizontal conductor that is exposed in said surface of said lower section of said vertical conductor whereby said leftmost vertical conductor contact area is the leftmost of said two vertical conductor contact areas when facing said vertical spiral coil is a direction of width of said horizontal conductors whereby said leftmost opening is the opening that aligns with said first input/output connector;

depositing a fifth layer of dielectric having a surface over said surface of said fourth layer of dielectric;

patterning and etching said fifth layer of dielectric thereby creating a trench in said fifth layer of dielectric in addition to creating openings that align with said underlying vertical contact areas of underlying horizontal conductors whereby said trench aligns and makes contact with said leftmost opening that has been created in said fourth layer of dielectric whereby furthermore said trench extends in said dimension of width of said horizontal conductors by a considerable amount;

depositing a layer of metal over said surface of said fifth layer of dielectric thereby including said trench and said openings that have been created in said fifth layer of dielectric; and planarizing said layer of metal that has been deposited over said surface of said fifth dielectric thereby creating a first input/output connector.

21. The method of claim 1 wherein said horizontal view one of said vertical spiral inductor shows said spiral of said vertical spiral inductor whereby said spiral starts at said first input/output connector and further continues by following interconnected vertical and horizontal conductors of said vertical spiral inductor in a clock-wise direction.

22. The method of claim 1 wherein said horizontal view one of said vertical spiral inductor shows said spiral of said vertical spiral inductor whereby said spiral starts at said first input/output connector and further continues by following interconnected vertical and horizontal conductors of said vertical spiral inductor in a counter clock-wise direction.

23. A method of creating a vertical spiral inductor containing horizontal and vertical conductors of a width Wc, said width having a direction separated by spacing further containing a first and a second input/output connector, said vertical spiral inductor containing a body that is bounded by a base horizontal conductor, two outer vertical conductors and said second input/output connector, whereby said vertical spiral inductor can be viewed in a direction of width that is parallel with said surface of said substrate resulting in a horizontal view one of said inductor, comprising the steps of:

providing a semiconductors substrate, said substrate having a surface;

creating a base section of said vertical spiral inductor having a surface further having a height Hb and a width Wc, said base section being created on said surface of said substrate;

creating a lower section of said vertical spiral inductor having a height Hl, said lower section being created overlying said surface of said base section;

creating a first input/output connector section having a height Hfio further having a surface, said first input/output section being created on said surface of said lower section;

creating an upper section of said vertical spiral inductor having a surface further having a height Hu, said upper section being created on said surface of said first input/output section; and creating a second input/output connector section having a surface further having a height Hsio, said second input/output section being created on said surface of said upper section.

* * * * *